(12) United States Patent
Ogura et al.

(10) Patent No.: US 6,828,199 B2
(45) Date of Patent: Dec. 7, 2004

(54) MONOS DEVICE HAVING BURIED METAL SILICIDE BIT LINE

(75) Inventors: Jusuke Ogura, Cupertino, CA (US); Mark T. Ramsbey, Sunnyvale, CA (US); Arvind Halliyal, Cupertino, CA (US); Zoran Krivokapic, Santa Clara, CA (US); Minh Van Ngo, Fremont, CA (US); Nicholas H. Tripisas, San Jose, CA (US)

(73) Assignees: Advanced Micro Devices, Ltd., Sunnyvale, CA (US); Fujitsu Limited, Kanagawa-ken (JP)

( * ) Notice: Subject to any disclaimer, the term of this patent is extended or adjusted under 35 U.S.C. 154(b) by 0 days.

(21) Appl. No.: 10/022,798

(22) Filed: Dec. 20, 2001

(65) Prior Publication Data

US 2003/0119314 A1 Jun. 26, 2003

(51) Int. Cl.⁷ ............................................. H01L 21/336
(52) U.S. Cl. ..................... 438/287; 438/257; 438/526; 438/719; 438/735
(58) Field of Search ................................ 438/287, 257, 438/267, 526, 719, 735

(56) References Cited

U.S. PATENT DOCUMENTS

| | | |
|---|---|---|
| 5,168,334 A | 12/1992 | Mitchell et al. |
| 5,670,297 A | 9/1997 | Ogawa et al. |
| 6,156,654 A | 12/2000 | Ho et al. |
| 6,177,318 B1 * | 1/2001 | Ogura et al. ............... 438/267 |
| 6,210,995 B1 * | 4/2001 | Brintzinger et al. ........ 438/132 |
| 6,248,635 B1 * | 6/2001 | Foote et al. ............... 438/287 |
| 6,261,908 B1 | 7/2001 | Hause et al. |
| 6,326,268 B1 * | 12/2001 | Park et al. ................. 438/262 |
| 6,350,643 B1 * | 2/2002 | Hintermaier et al. ....... 438/240 |
| 6,355,543 B1 * | 3/2002 | Yu ............................ 438/535 |
| 6,365,446 B1 * | 4/2002 | Chong et al. .............. 438/197 |
| 6,413,821 B1 * | 7/2002 | Ebina et al. ............... 438/257 |
| 6,420,264 B1 * | 7/2002 | Talwar et al. ............. 438/682 |
| 6,448,113 B2 * | 9/2002 | Lee et al. .................. 438/132 |
| 6,483,736 B2 * | 11/2002 | Johnson et al. ............ 365/130 |
| 6,492,677 B2 * | 12/2002 | Takahashi et al. ......... 257/316 |
| 6,495,921 B1 * | 12/2002 | Burton et al. ............. 257/774 |
| 6,566,200 B2 | 5/2003 | Mehrad et al. |
| 2002/0045319 A1 * | 4/2002 | Ogura et al. ............... 438/303 |

FOREIGN PATENT DOCUMENTS

EP    0 368 097 A    5/1990

* cited by examiner

Primary Examiner—Richard Elms
Assistant Examiner—Brad Smith

(57) ABSTRACT

A MONOS device and method for making the device has a charge trapping dielectric layer, such as an oxide-nitride-oxide (ONO) layer, formed on a substrate. A recess is created through the ONO layer and in the substrate. A metal silicide bit line is formed in the recess and bit line oxide is formed on top of the metal silicide. A word line is formed over the ONO layer and the bit line oxide, and a low resistance silicide is provided on top of the word line. The silicide is formed by laser thermal annealing, for example.

9 Claims, 4 Drawing Sheets

… (US 6,828,199 B2)

MONOS DEVICE HAVING BURIED METAL SILICIDE BIT LINE

FIELD OF THE INVENTION

The present invention relates to the field of semiconductor device manufacture, and more particularly, to the fabrication of metal oxide nitride oxide semiconductor (MONOS) cells.

BACKGROUND OF THE INVENTION

FIG. 1, to which reference is made, illustrates a typical prior art MONOS cell. The cell includes a substrate 10 in which are implanted a source 12 and a drain 14 and on top of which lies an oxide-nitride-oxide (ONO) structure 16 having a layer of nitride 17 sandwiched between two oxide layers 18 and 20. On top of the ONO structure 16 lies a gate conductor 22. Between source 12 and drain 14 is a channel 15 formed under ONO structure 16.

Nitride section 17 provides the retention mechanism for programming the memory cell. Specifically, when programming voltages are provided to source 12, drain 14 and gate conductor 22, electrons flow towards 14. According to the hot electron injection phenomenon, some hot electrons penetrate through the lower section of silicon oxide 18, and especially if section 18 is thin, they are then collected in nitride section 17. As is known in the art, nitride section 17 retains a received charge labeled 24, in a concentrated area adjacent drain 14. Concentrated charge 24 significantly raises the threshold of the portion of the channel of the memory cell under charge 24 to be higher than the threshold of the remaining portion of the channel 15.

When concentrated charge 24 is present (i.e., the cell is programmed), the raised threshold of the cell does not permit the cell to be placed into a conductive state during reading of the cell. If concentrated charge 24 is not present, the read voltage on gate conductor 22 can overcome the much lower threshold and accordingly, channel 15 becomes inverted and hence, conductive.

Dopants may be implanted into a substrate to form buried bit lines. Such bit lines are limited in terms of scaling of the semiconductor device, and also are limited in terms of the resistance of the bit line. There is a need for a buried bit line in an MONOS device with very low resistance, thereby allowing scaling down of the bit line and the shrinking of the cell size.

SUMMARY OF THE INVENTION

This and other needs are met by embodiments of the present invention which provide a method of forming an MONOS (metal oxide nitride oxide semiconductor) device, comprising the steps of forming a charge trapping dielectric layer on a substrate, and etching a recess through the charge trapping dielectric layer in accordance with the bit line pattern. A metal silicide bit line is then formed in the recess.

The use of metal silicide in the bit line provides a very low resistance bit line that allows scaling downwardly of the width of the bit line. It reduces the frequency of contacting bit line and allows shrinkage of the cell size. Also, a planar architecture of the bit line may be provided.

In certain embodiments of the invention, a laser thermal annealing process is used to form the metal silicide within the recess in the substrate. The use of laser thermal annealing enables the metal silicide to be formed in a controlled manner, with a low thermal budget and precise application of the laser energy to areas to be silicided.

The earlier stated needs are also met by embodiments of the present invention which provide a metal oxide nitride oxide semiconductor (MONOS), comprising a substrate, a charge trapping dielectric layer on the substrate, and a recess in the charge trapping dielectric layer. A metal silicide bit line is provided in the recess.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to MONOS devices with buried bit lines. In particular, the present invention reduces the resistance of buried bit lines in MONOS devices, which bit lines were typically formed by implanted ions. Through the formation of metal silicide bit lines, the present invention produces very low resistance bit lines and allows scaling down of the width of the bit lines, as well as reducing the frequency of contacting bit lines. Furthermore, the use of the metal silicide bit lines allows shrinkage of the cell size.

Figure 1:
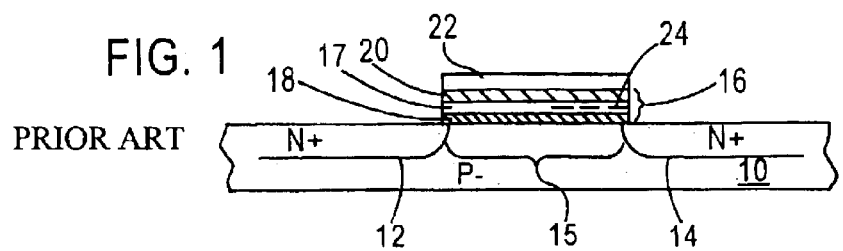
FIG. 1 is a schematic illustration of a prior art MONOS memory cell.
Figure 2:
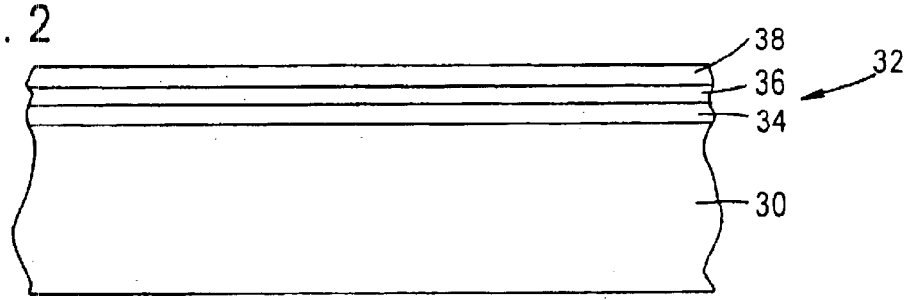
FIG. 2 is a schematic cross-section of a portion of a MONOS device following the formation of an ONO layer on a substrate.

FIG. 2 is a cross-section of a portion of an MONOS cell architecture with a substrate 30. The substrate 30 is a P-substrate in FIG. 2. The substrate 30 is overlaid with a charge trapping dielectric layer 32. In the following described embodiment, the charge trapping dielectric layer 32 is referred to as an ONO layer 32. However, in other embodiments of the invention, other types of charge trapping layers are employed, such as an oxide/silicon oxynitride/oxide layer, etc., known to those of skill in the art. For the illustrated exemplary embodiment of an ONO layer 32, a bottom oxide layer 34 is grown over the substrate 30 to a desired thickness. This is followed by deposition of a nitride layer 36 over the bottom oxide layer 34. A top oxide layer 38 is produced, either through oxidation of the nitride, by deposition or a combination thereof. The formation of the ONO layer 32 is well known to those of ordinary skill in the art and any such conventional methodology may be employed to produce the ONO layer 32.

Figure 3:
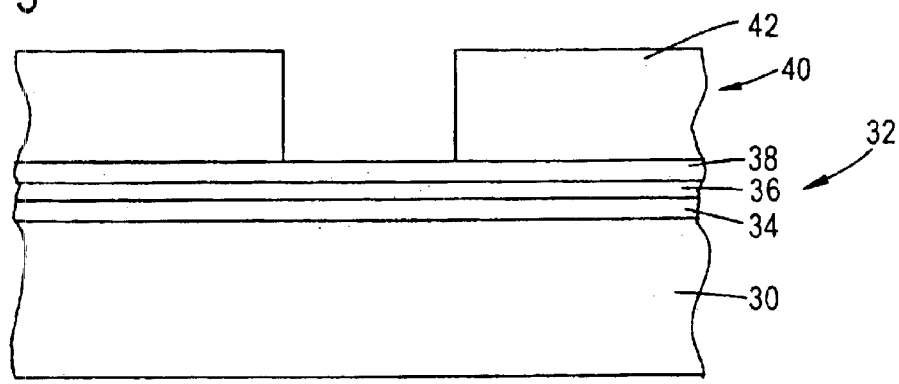
FIG. 3 shows the structure of FIG. 2, following the formation of a bit line mask on the ONO layer in accordance with embodiments of the present invention.

The next step involves depositing a bit line mask 40 (typically photoresist 42 patterned in a well-known manner), whose layout within the memory array portion of the chip is provided to create bit lines, forming lines of sources and lines of drains. The side view of FIG. 3 illustrates the portion of the MONOS within the memory array portion with the photoresist 42 patterned. The photoresist columns 42 of the bit line mask 40 define the areas where the bit lines will not be provided. These are the locations of the channels of the devices.

Figure 4:
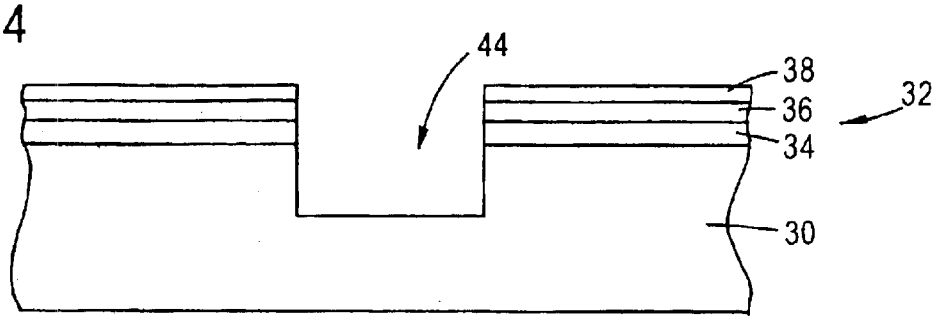
FIG. 4 depicts the structure of FIG. 3, after a recess has been etched through the ONO layer and into the substrate, in accordance with embodiments of the present invention.

Referring to FIG. 4, the ONO layer 32 is etched through in accordance with the bit line mask 40. The etching continues through the ONO layer 32 and into the substrate 30 to a specified depth. An anisotropic etch, which is a reactive ion etch, may be employed to form the etching step. Following the etching step, the bit line mask 40 is removed by conventional photoresist removal techniques.

After the etching process is completed to provide the recess 44 in substrate 30, a refractory metal layer 46 is deposited over the substrate 30 and the ONO layer 32. The refractory metal layer 46 may be any of a number of different materials, such as tungsten, cobalt, nickel, titanium, platinum, palladium, etc. Such metals are known to react with silicon to form metal silicides. The deposition of the refractory metal layer 46 may be performed in a conventional manner.

Figure 5:
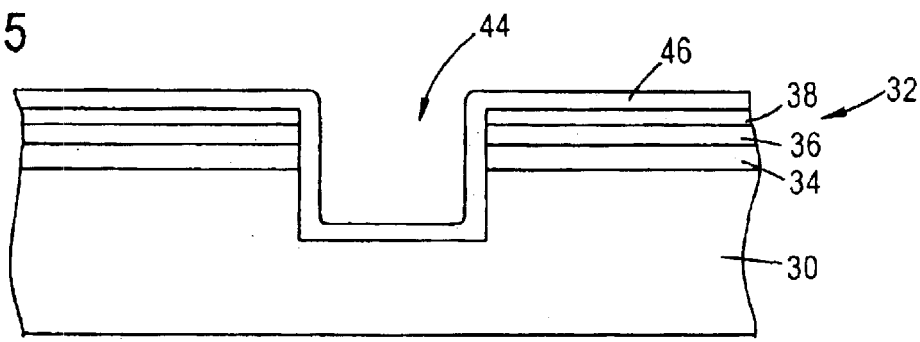
FIG. 5 shows the structure of FIG. 4, following the deposition of a refractory metal layer.
Figure 6:
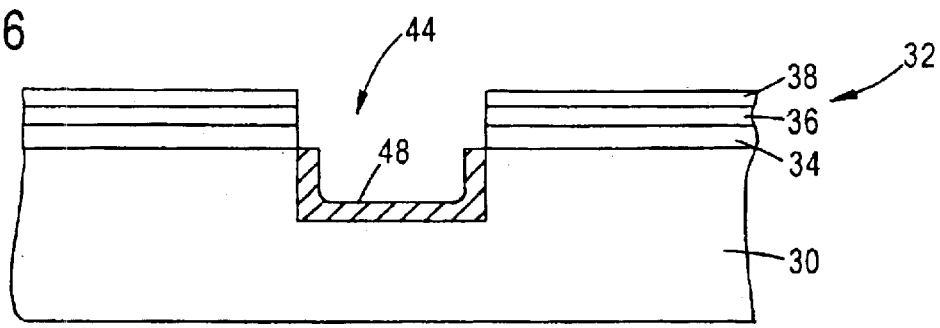
FIG. 6 depicts the structure of FIG. 5, following the annealing to form metal silicide and after unreacted metal is removed from the structure, in accordance with embodiments of the present invention.

FIG. 6 shows the structure of FIG. 5 after an annealing step is performed to create silicide within the recess 44. The silicide 48 is preferably a low resistance phase of the particular metal silicide that is formed. A rapid thermal annealing (RTA) process may be employed to cause the refractory metal 46 to react with the silicon in the substrate 30 to form the metal silicide. However, in certain embodiments of the present invention, a laser thermal annealing (LTA) process is used to react the metal with the silicon. Arrows 15 in FIG. 6 indicate this. Some of the advantages of using LTA to form the silicide is the lower thermal budget provided by LTA, and the precise control of the area to which the laser energy is applied that is possible with LTA. In other words, the laser energy can be directed relatively precisely at the recesses 44 to anneal the metal silicide.

The energy fluence of the laser is readily determined by one of ordinary skill in the art, and will be dependent upon the type of silicide to be formed, the desired thickness of the silicide, etc. Exemplary parameters of the laser thermal annealing include providing an energy fluence of between about 50 mJ/cm$^2$ to about 1.3 J/cm$^2$.

FIG. 6 also shows the structure after removal of any unreacted metal remaining after the annealing process is complete and the silicide has been formed. Such unreacted removal techniques are well known to those of ordinary skill in the art, and depend upon the particular type of metal silicide that has been formed.

Figure 7:
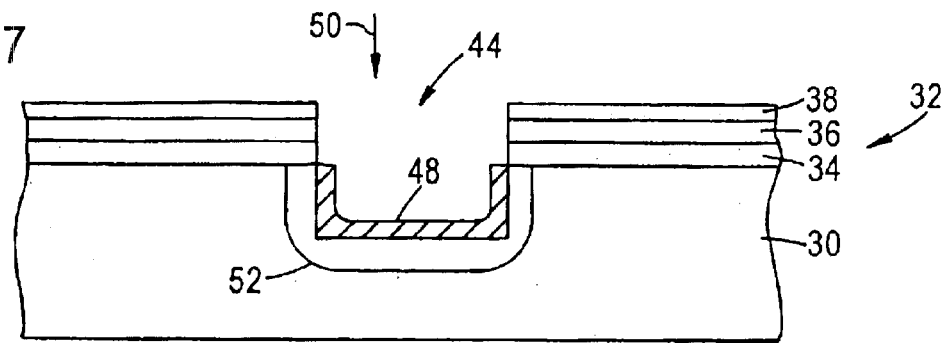
FIG. 7 shows the structure of FIG. 6, following the masking and implantation of source/drain regions, in accordance with embodiments of the present invention.

In FIG. 7, an ion implantation process has been performed to create source/drain regions 52 in the substrate 30. The source/drain regions are formed by the implantation of arsenic through the metal silicide bit line 48, so that the source/drain regions underlie the bit lines 48. A conventional masking and implantation process may be employed to create the source/drain regions 52. One of ordinary skill in the art may select the appropriate dosage and implant energies. It should be appreciated, however, that the masking step may not be necessary as a self-aligned implant may be used in which the implants are self-aligned to the ONO structures.

Although the ion implantation process is depicted as occurring after the silicidation process in the exemplary embodiment, in other embodiments of the invention, the ion implantation is performed prior to the silicidation process. For example, with proper selection of implant energies, the dopants can be implanted after the bit line mask 40 is formed. However, a more preferred embodiment implants the dopants immediately after the etching is completed, thereby preventing unwanted removal of the implanted species.

Figure 8:
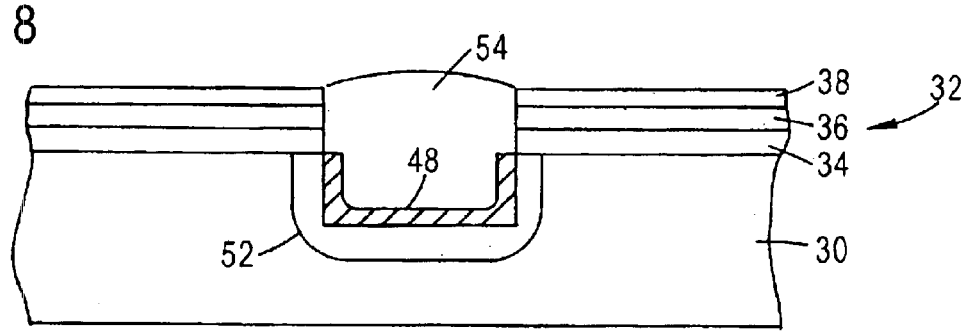
FIG. 8 depicts the structure of FIG. 7, following the formation of bit line oxide over the metal silicide bit lines, in accordance with embodiments of the present invention.
Figure 9:
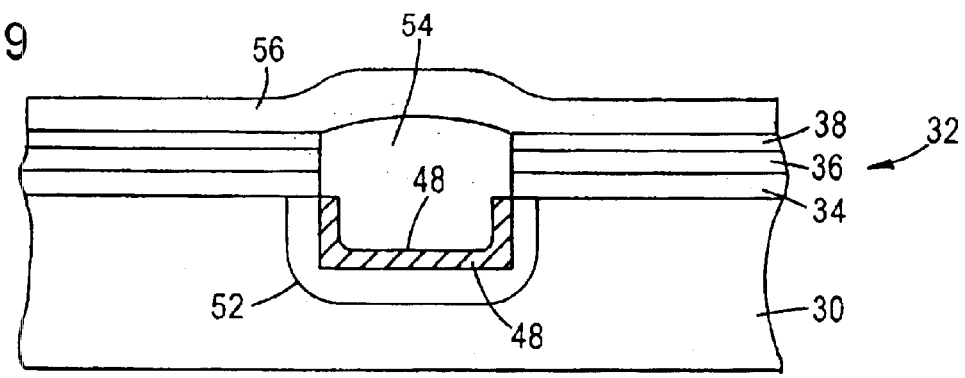
FIG. 9 shows the structure of FIG. 8, after polysilicon word lines have been deposited over the ONO layer and the bit line oxide in accordance with embodiments of the present invention.

A bit line oxide 54 is formed in the recess 44 on top of the metal silicide bit line 48, as seen in FIG. 8. The bit line oxide 54 may be thermally grown over the bit lines 48 in an oxidation operation. The oxidation process may be a low temperature oxidation of about 800° C. Alternatively, the bit line oxide 54 may be deposited. Following the formation of the bit line oxide 54, polysilicon or metal word lines 56 are deposited over the bit line oxide 54 and the ONO layer 32. The polysilicon word lines are formed in accordance with a word line mask (shown in FIG. 9). The bit line oxide 54 may include some or all of the top oxide layer 38 of the ONO layer 32.

A low resistance silicide 58 is then provided on top of the polysilicon word line 56. This may be accomplished by the deposition of a refractory metal on the polysilicon word lines 56 and annealing (RTA or LTA for example). The metal that is not on the polysilicon will cover the oxide of the ONO layer 32 or the bit line oxide 54 and hence, will not react with the oxide to form silicide. The unreacted metal may be removed by a conventional technique.

Figure 10:
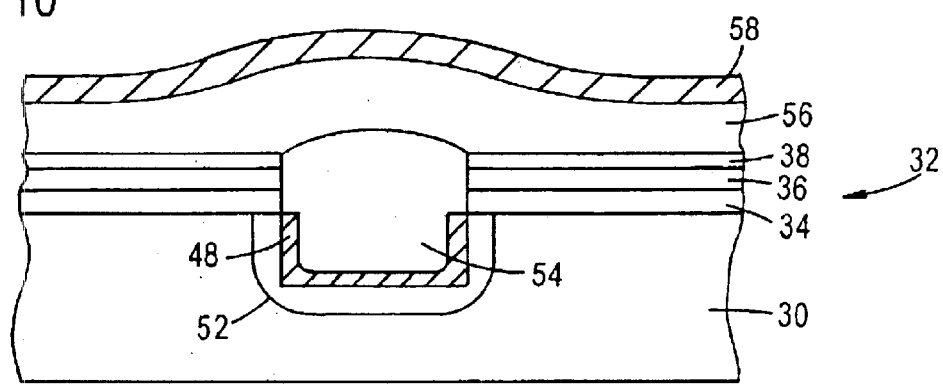
FIG. 10 shows the structure of FIG. 9, after a low resistance silicide has been formed on the polysilicon word lines, in accordance with embodiments of the present invention.

As depicted in the resulting structure of FIG. 10, a MONOS device with a buried metal silicide bit line 48 is provided by the methodology of present invention. The MONOS device as created has a very low resistance bit line, improving device performance, and allowing the width of the bit line to be reduced and the cell size to also be reduced. Further, the frequency of contacting the bit line may also be reduced. Another advantage of the structure is the planar architecture that the use of a metal silicide bit line provides.

Figure 11:
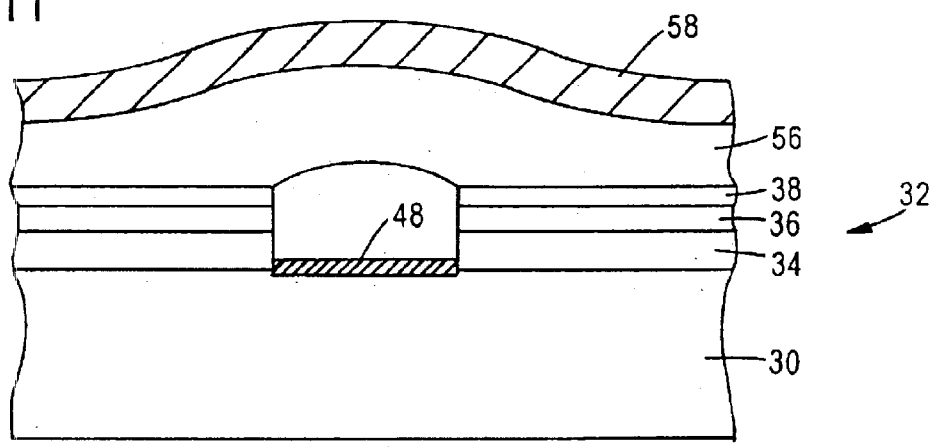
FIG. 11 shows an alternative embodiment of the present invention.

In alternative embodiments, as depicted in FIG. 11, the substrate 30 is not etched, only the ONO layer 32 down to the substrate 30. The silicide 48 is formed on the substrate 30.

Although the present invention has been described and illustrated in detail, it is to be clearly understood that the same is by way of illustration and example only and is not to be taken way limitation, the scope of the present invention being limited only by the terms of the appended claims.

What is claimed is:

1. A method of forming a MONOS (metal oxide nitride oxide semiconductor) device, the method comprising the steps of:

forming a charge trapping dielectric layer on a substrate;

etching a recess through the charge trapping dielectric layer and into the substrate in accordance with a bit line pattern;

forming a metal silicide bit line in the recess; and forming oxide in the recess such that the metal silicide bit line is a buried bit line that is contained entirely within the substrate.

2. The method of claim 1, wherein the step of forming a metal silicide bit line includes:

depositing a refractory metal in the recess; and laser thermal annealing within the recess to form metal silicide in the recess.

3. The method of claim 2, further comprising implanting dopants into the substrate to form source/drain regions below the metal silicide bit line.

4. The method of claim 3, further comprising forming oxide in the recess over the metal silicide bit line.

5. The method of claim 4, further comprising forming word lines over the charge trapping dielectric layer and the oxide.

6. The method of claim 5, further comprising forming low resistance silicide on the word lines.

7. The method of claim 2, wherein the step of laser thermal annealing comprises applying laser energy with an energy fluence of between about 50 mJ/cm$^2$ to about 1.3 J/cm$^2$.

8. The method of claim 1, wherein the charge trapping layer is an oxide-nitride-oxide layer.

9. The method of claim 1, wherein the step of etching includes etching the recess into the substrate.

* * * * *